United States Patent
Jia et al.

(10) Patent No.: US 11,802,892 B2
(45) Date of Patent: Oct. 31, 2023

(54) SYSTEMS, CIRCUITS, AND METHODS FOR DETERMINING STATUS OF FUSE OR RELAY

(71) Applicant: Suzhou Littelfuse OVS Co., Ltd., Suzhou (CN)

(72) Inventors: Yanqiu Jia, Suzhou (CN); Yu Wang, Suzhou (CN); Du Cheng, Suzhou (CN)

(73) Assignee: Suzhou Littelfuse OVS Co., Ltd., Suzhou (CN)

( * ) Notice: Subject to any disclaimer, the term of this patent is extended or adjusted under 35 U.S.C. 154(b) by 0 days.

(21) Appl. No.: 17/772,717

(22) PCT Filed: Oct. 29, 2019

(86) PCT No.: PCT/CN2019/114021
§ 371 (c)(1),
(2) Date: Apr. 28, 2022

(87) PCT Pub. No.: WO2021/081755
PCT Pub. Date: Jun. 5, 2021

(65) Prior Publication Data
US 2023/0003773 A1    Jan. 5, 2023

(51) Int. Cl.
*G01R 19/10* (2006.01)
*G01R 15/22* (2006.01)
*G01R 19/25* (2006.01)

(52) U.S. Cl.
CPC .............. *G01R 19/10* (2013.01); *G01R 15/22* (2013.01); *G01R 19/2513* (2013.01)

(58) Field of Classification Search
CPC ............... G01R 19/10; G01R 19/2513; G01R 19/0084; G01R 15/22; G01R 31/74; G01R 31/3275; G08C 19/02; H04L 2101/627
See application file for complete search history.

(56) References Cited

U.S. PATENT DOCUMENTS

| | | | | |
|---|---|---|---|---|
| 5,652,526 A | * | 7/1997 | Sullivan | G01R 31/34 324/765.01 |
| 5,751,536 A | * | 5/1998 | Haddad | H02H 5/12 307/328 |

(Continued)

FOREIGN PATENT DOCUMENTS

| CN | 202013862 U | 10/2011 |
|---|---|---|
| CN | 204559232 U | 8/2015 |

(Continued)

OTHER PUBLICATIONS

European Search Report and Written Opinion for the European Application No. EP19950595, dated Oct. 12, 2022, 8 pages.

(Continued)

*Primary Examiner* — Vinh P Nguyen
(74) *Attorney, Agent, or Firm* — KDW Firm PLLC

(57) ABSTRACT

Provided herein are approaches for determining a status of a fuse or relay. In some embodiments, a system may include a first fuse or relay connected between a first input and a first output, and an optocoupler electrically connected with the first fuse or relay, wherein the optocoupler is operable to monitor a differential voltage of the first input or the first output. The system may further include an input/output (IO) expander receiving a status signal representing a state of the first fuse or relay, wherein only a single input port of the IO expander receives the status signal representing the state of the first fuse or relay.

18 Claims, 2 Drawing Sheets

(56) References Cited

U.S. PATENT DOCUMENTS 8,762,083 B2 * 6/2014 Rodseth ............... G01R 31/74
                                                              702/65
2010/0023286 A1 1/2010 Rodseth et al.

FOREIGN PATENT DOCUMENTS

| | | |
|---|---|---|
| CN | 206906516 U | 1/2018 |
| CN | 206960589 U | 2/2018 |
| CN | 109738751 A | 5/2019 |
| DE | 102016119496 A1 | 4/2018 |
| EP | 2857851 A1 | 4/2015 |

OTHER PUBLICATIONS

N.A. N.A.: "Microcontroller input/output expander" AN2591 Application note, Aug. 1, 2007, pp. 1-19. URL:https://www.st.com/resource/en/application_note/an2591-microcontroller-input-output-expander-stmicroelectronics.pdf.
N.A. N.A .: "GPIO expander" Sep. 1, 2010, pp. 1-6. URL: https://www.nxp.com/docs/en/brochure/75016987.pdf.
International Search Report and Written Opinion dated Jul. 24, 2020 for PCT application, PCT/CN2019/114021 filed Oct. 29, 2019.

* cited by examiner

SYSTEMS, CIRCUITS, AND METHODS FOR DETERMINING STATUS OF FUSE OR RELAY

FIELD OF THE DISCLOSURE

The disclosure relates generally to fuses and relays and, more particularly, to systems, circuits, and methods for determining a status of fuses and/or relays.

BACKGROUND OF THE DISCLOSURE

Increasingly, power distribution modules, or fuse and relay boxes, require controller Area Network (CAN) communication to achieve real time monitoring of fuse and/or relay statuses. One existing monitoring solution is to check both input voltage and output voltage independently, which is then read by a controller via multiplexer. The two results (i.e., input and output of rely or fuse) are then compared by the controller. However, multiplexer power supply voltage is typically limited, especially at the high-voltage end. As a result, the multiplexor is more easily damaged by an over voltage. Furthermore, conventional monitoring solutions require two inputs to predict each fuse or relay status.

SUMMARY

In view of the foregoing, described herein are systems, circuits, and methods for determining a status of fuses and/or relays one or more relays. In one approach, a system may include a first fuse or relay connected between a first input and a first output, and an optocoupler electrically connected with the first fuse or relay, wherein the optocoupler is operable to monitor a differential voltage of the first input or the first output. The system may further include an input/output (IO) expander receiving a status signal representing a state of the first fuse or relay, wherein only a single input port of the IO expander receives the status signal representing the state of the first fuse or relay.

In another approach, a circuit may include a first fuse or relay electrically connected between a first input and a first output, and an optocoupler electrically connected with the first fuse or relay, wherein the optocoupler monitors a differential voltage of the first input or the first output. The circuit may further include an input/output (IO) expander receiving a status signal representing a state of the first fuse or relay, wherein only a single input port of the IO expander receives the status signal representing the state of the first fuse or relay.

In yet another approach, a method for determining a status of a fuse or relay may include electrically connecting a first fuse or relay between a first input and a first output, electrically connecting an optocoupler with the first fuse or relay, monitoring, via the optocoupler, a differential voltage of the first input or the first output, and receiving, at an input/output (IO) expander, a status signal representing a state of the first fuse or relay, wherein only a single input port of the IO expander receives the status signal representing the state of the first fuse or relay.

Figure 1:
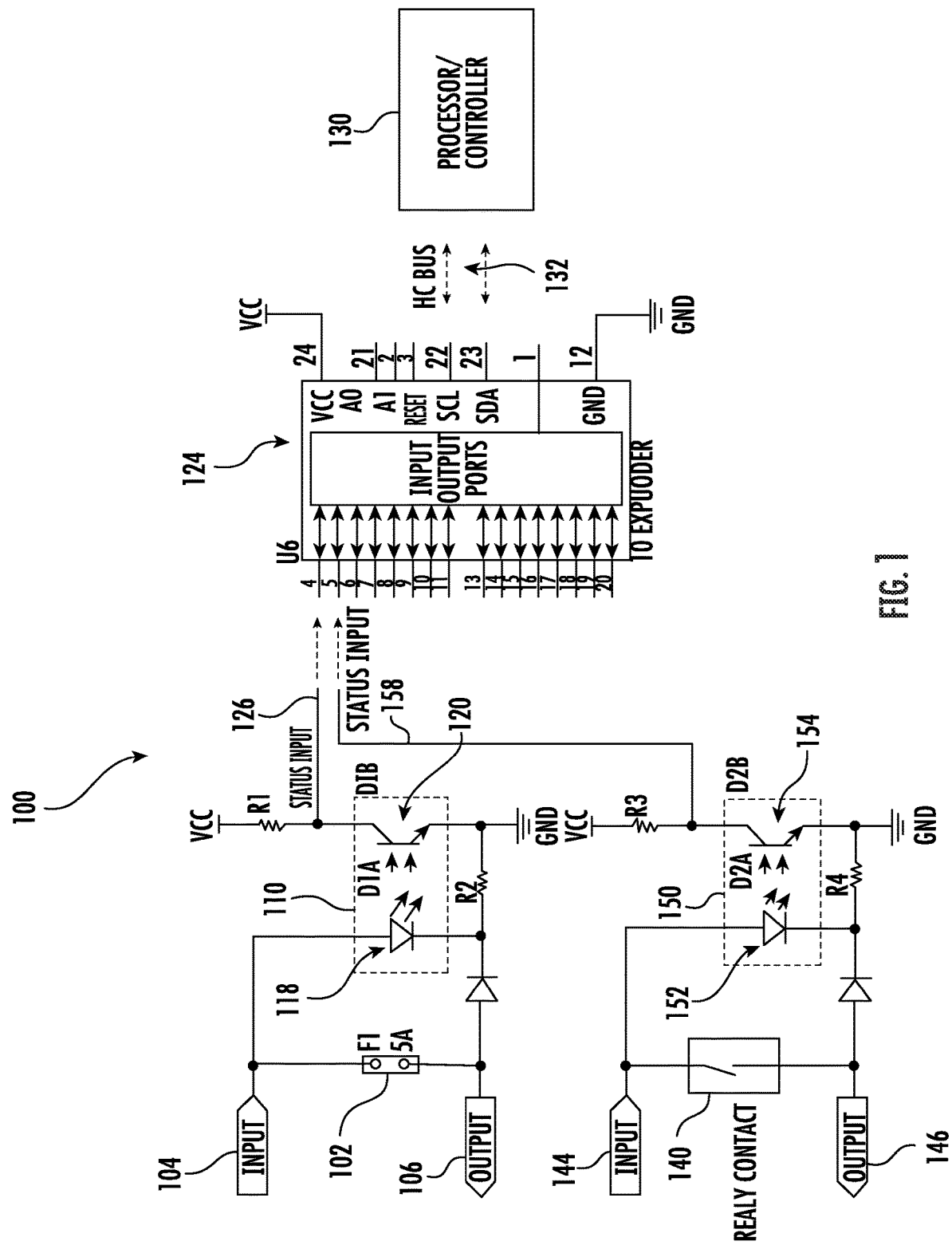
FIG. 1 is a schematic of a system/circuit including an optocoupler for determining a status of fuses and/or relays according to exemplary embodiments.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

Furthermore, certain elements in some of the figures may be omitted, or illustrated not-to-scale, for illustrative clarity. Furthermore, for clarity, some reference numbers may be omitted in certain drawings.

DETAILED DESCRIPTION

Embodiments in accordance with the present disclosure will now be described more fully hereinafter with reference to the accompanying drawings. The system/circuit and methods may be embodied in many different forms and should not be construed as being limited to the embodiments set forth herein. Rather, these embodiments are provided so that this disclosure will be thorough and complete, and will fully convey the scope of the system and method to those skilled in the art.

As mentioned above, current art solutions check both input voltage and output voltage independently, which is then read by controller via multiplexer. The two results (i.e., input and output of rely or fuse) are then compared by the controller. As will be described in greater detail herein, embodiments of the present disclosure include an optocoupler for monitoring differential voltage of the fuse or relay input and output, wherein the detector side of the optocoupler may only have high or low voltage level to be read by a controller via input/output (IO) expander or multiplexer. The advantage is saving input quantities along with increased reliability due to the isolation between battery input voltage (e.g., high) and logic voltage level (e.g., low).

Referring now to FIG. 1, a schematic of a circuit/system (hereinafter "system") 100 according to embodiments of the present disclosure will be described. In exemplary embodiments, the system 100 may include a fuse 102 connected between a first input 104 and a first output 106. In other embodiments, a relay may be connected between the first input 104 and the first output 106 instead of the fuse 102. Connected to the fuse 102 is a first optocoupler 110, wherein the first optocoupler 110 is operable to monitor a differential voltage of the first input 104 or the first output 106. The first optocoupler 110 may be responsive to a voltage provided by a first voltage source (VCC). In some embodiments, a first resistor (R1) is provided between the first voltage source and the first optocoupler 110. A second resistor (R2) may be electrically connected between the first optocoupler 110 and the fuse 102. As shown, the first optocoupler 110 may include a light source 118 (e.g., LED) operable with a detector 120.

The system 100 may further include an input/output (IO) expander or multiplexer 124 receiving a status signal 126 representing a state of the fuse 102. As will be described in greater detail herein, only a single input port (e.g., one of ports 4-20) of the IO expander 124 receives the status signal 126. As further shown, the IO expander 124 may be connected to a processor or controller 130 via a bus 132 (e.g., an inter-integrated circuit bus or a serial peripheral interface bus).

The controller 130 may include processing circuitry for storing and processing information, including a microprocessor and memory. It is understood that the processing circuitry may contain additional components, including processors, memories, error and parity/CRC checkers, data encoders, anticollision algorithms, controllers, command decoders, security primitives and tamperproofing hardware, as necessary to perform the functions described herein.

As further shown, the system may include a relay 140 connected between a second input 144 and a second output 146. In other embodiments, a second fuse may be connected between the second input 144 and the second output 146. Connected to the relay 140 is a second optocoupler 150, wherein the second optocoupler 150 is operable to monitor a differential voltage of the second input 144 or the second output 146. The second optocoupler 150 may be responsive to a voltage provided by a second voltage source (VCC). In some embodiments, a third resistor (R3) is provided between the second voltage source and the second optocoupler 150. Furthermore, a fourth resistor (R4) may be electrically connected between the second optocoupler 150 and the relay 140. As shown, the second optocoupler 150 may include a light source 152 (e.g., LED) operable with a detector 154.

The IO 124 may receive a status signal 158 representing a state of the relay 140. In exemplary embodiments, only a single input port (e.g., one of ports 4-20 not receiving the status signal 126) of the IO expander 124 receives the status signal 158.

During an example operation of the system, the first optocoupler 110 may be tasked with monitoring the status of the fuse 102. The high voltage level may be shifted to a logic voltage level and read by the IO expander 124 via the bus 132 with the processor or controller 130. If the fuse 102 is normal (i.e., not fused), the light source 118 is not illuminated, thus the detector 120 is off and voltage to the IO expander 124 is pulled up to logic high. If the fuse 102 is broken/open, the light source 118 is illuminated, thus the detector 120 is on and the input voltage is pulled down to logic low. In this example, only one input can detect/receive the status signal 126 from the fuse 102. Furthermore, a wide input voltage is permitted because the input reading circuit is isolated against high voltage side. As a result, a high voltage will not damage the monitoring circuit as long suitably rated resistors (R1 and R2) are selected.

Similarly, the second optocoupler 150 may be tasked with monitoring the status of the relay 140. Again, the high voltage level may be shifted to a logic voltage level and read by the IO expander 124 via the bus 132 with the processor or controller 130. If the relay 140 is in a normal state (i.e., open if relay is normally open, and closed if relay is normally closed), the light source 152 is not illuminated, thus the detector 154 is off and voltage to the IO expander 124 is pulled up to logic high. If the relay 140 is switched from its normal state, the light source 152 is illuminated, thus the detector 154 is on and the input voltage is pulled down to logic low. In this example, only one input can detect/receive the status signal 158 from the relay 140. Furthermore, a wide input voltage is permitted because the input reading circuit is isolated against high voltage side. As a result, a high voltage will not damage the monitoring circuit as long suitably rated resistors (R3 and R4) are selected.

Figure 2:
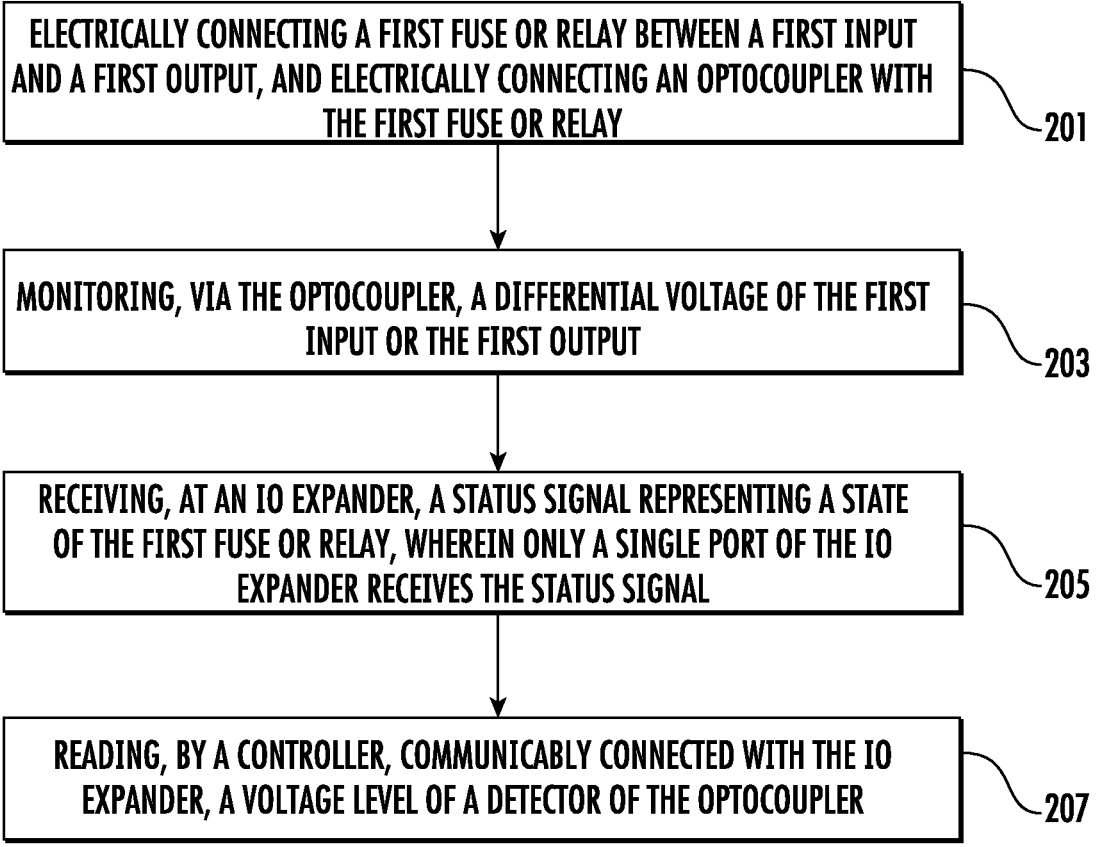
FIG. 2 is a method for determining a status of fuses and/or relays using the system/circuit of FIG. 1 according to exemplary embodiments.

Turning now to FIG. 2, a method 200 for determining a status of a fuse or relay according to exemplary embodiments will be described in greater detail. As shown, at block 201, the method 200 may include electrically connecting a first fuse or relay between a first input and a first output, and electrically connecting an optocoupler with the first fuse or relay. At block 203, the method may include monitoring, via the optocoupler, a differential voltage of the first input or the first output. At block 205, the method 200 may include receiving, at an input/output (IO) expander, a status signal representing a state of the first fuse or relay, wherein only a single input port of the IO expander receives the status signal representing the state of the first fuse or relay.

At block 207, the method 200 may further include reading, by a controller communicably connected with the IO expander, a voltage level of a detector of the optocoupler. In some embodiments, the method 200 may optionally include electrically connecting a second resistor between the optocoupler and the first fuse or relay, electrically connecting a second optocoupler with the second fuse or relay, monitoring, via the second optocoupler, a differential voltage of the second input or the second output, and receiving, at the input/output (IO) expander, a status signal representing a state of the second fuse or relay.

Although the illustrative method 200 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be required to implement a methodology in accordance with the present disclosure.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A system, comprising:
    a first fuse or relay connected between a first input and a first output;
    an optocoupler electrically connected with the first fuse or relay, wherein the optocoupler is operable to monitor a differential voltage of the first input or the first output;
    an input/output (IO) expander receiving a status signal representing a state of the first fuse or relay, wherein only a single input port of the IO expander receives the status signal representing the state of the first fuse or relay; and
    a first voltage supply, and a first resistor between the first voltage supply and the optocoupler.

2. The system of claim 1, further comprising a controller communicably connected with the IO expander, the controller operable to read a voltage level of a detector of the optocoupler.

3. The system of claim 2, wherein the controller and the IO expander are connected by a bus.

4. The system of claim 3, wherein the bus is an inter-integrated circuit bus or a serial peripheral interface bus.

5. The system of claim 1, further comprising a second resistor between the optocoupler and the first fuse or relay.

6. The system of claim 1, further comprising a second fuse or relay connected between a second input and a second output, wherein the optocoupler is operable to monitor a differential voltage of the second input or the second output, wherein the IO expander receives a second status signal representing a state of the second fuse or relay, wherein only a single input port of the IO expander receives the second status signal representing the state of the second fuse or relay.

7. The system of claim 6, further comprising:
    a second voltage supply, and a third resistor between the second voltage supply and the optocoupler; and
    a fourth resistor between the optocoupler and the second fuse or relay.

8. A circuit, comprising:
    a first fuse or relay electrically connected between a first input and a first output; an optocoupler electrically connected with the first fuse or relay, wherein the optocoupler monitors a differential voltage of the first input or the first output;
    an input/output (IO) expander receiving a status signal representing a state of the first fuse or relay, wherein only a single input port of the IO expander receives the status signal representing the state of the first fuse or relay; and
    a first voltage supply, and a first resistor between the first voltage supply and the optocoupler.

9. The circuit of claim 8, further comprising a controller communicably connected with the IO expander, the controller operable to read a voltage level of a detector of the optocoupler.

10. The circuit of claim 9, wherein the controller and the IO expander are connected by a bus.

11. The circuit of claim 10, wherein the bus is an inter-integrated circuit bus or a serial peripheral interface bus.

12. The circuit of claim 8, further comprising a second resistor between the optocoupler and the first fuse or relay.

13. The circuit of claim 8, further comprising a second fuse or relay connected between a second input and a second output, wherein the optocoupler is operable to monitor a differential voltage of the second input or the second output, wherein the IO expander receives a second status signal representing a state of the second fuse or relay, wherein only a single input port of the IO expander receives the second status signal representing the state of the second fuse or relay.

14. A method for determining a status of a fuse or relay, comprising:
    electrically connecting a first fuse or relay between a first input and a first output;
    electrically connecting an optocoupler with the first fuse or relay;
    electrically connecting a first resistor between a first voltage supply and the optocoupler;
    monitoring, via the optocoupler, a differential voltage of the first input or the first output; and
    receiving, at an input/output (IO) expander, a status signal representing a state of the first fuse or relay, wherein only a single input port of the IO expander receives the status signal representing the state of the first fuse or relay.

15. The method of claim 14, further comprising reading, by a controller communicably connected with the IO expander, a voltage level of a detector of the optocoupler.

16. The method of claim 14, further comprising electrically connecting a second resistor between the optocoupler and the first fuse or relay.

17. The method of claim 14, further comprising:
    electrically connecting a second optocoupler with a second fuse or relay;
    monitoring, via the second optocoupler, a differential voltage of a second input or a second output of the second fuse or relay; and
    receiving, at the input/output (IO) expander, a second status signal representing a state of the second fuse or relay.

18. The method of claim 17, further comprising receiving the second status signal at a single input port of the IO expander.

* * * * *